United States Patent [19]

Sawada et al.

[11] Patent Number: 5,361,407
[45] Date of Patent: Nov. 1, 1994

[54] DOUBLE SUPERHETERODYNE RECEIVER WITH INDEPENDENT FREQUENCY CALIBRATION OF TWO LOCAL OSCILLATORS

[75] Inventors: Takeshi Sawada, Tokyo; Tadashi Sakai, Kanagawa, both of Japan

[73] Assignee: Sony Corporation, Tokyo, Japan

[21] Appl. No.: 980,549

[22] Filed: Nov. 23, 1992

[30] Foreign Application Priority Data

Dec. 2, 1991 [JP] Japan ................................. 3-344024

[51] Int. Cl.$^5$ ............................................ H04B 1/26
[52] U.S. Cl. ................................. 455/209; 455/258; 455/316
[58] Field of Search ............... 455/315, 316, 317, 318, 455/319, 314, 258, 260, 207, 208, 209

[56] References Cited

U.S. PATENT DOCUMENTS

| | | | |
|---|---|---|---|
| 3,593,153 | 7/1971 | Maitland | 455/316 |
| 3,938,048 | 2/1976 | Elliott | 455/315 |
| 4,512,035 | 4/1985 | Victor | 455/316 |
| 4,545,072 | 8/1985 | Skutta | 455/315 |
| 4,696,056 | 9/1987 | Morita | 455/316 |
| 4,727,591 | 2/1988 | Manlove | 455/182.2 |
| 5,203,032 | 4/1993 | Usui | 455/316 |

FOREIGN PATENT DOCUMENTS 0124332 11/1984 European Pat. Off. .
0253680 1/1988 European Pat. Off. .
0412207 2/1991 European Pat. Off. .

Primary Examiner—Edward F. Urban
Assistant Examiner—Mark D. Wisler
Attorney, Agent, or Firm—Lewis H. Eslinger; Jay H. Maioli

[57] ABSTRACT

A superheterodyne receiver comprises a variable frequency oscillator of PLL (phase-locked loop) type for implementing a first local oscillator and a variable frequency oscillator not of PLL type for implementing a second local oscillator. At least the frequency of a first locally generated signal is varied at reception to vary a received frequency, the frequency of the first locally generated signal is set at frequency calibration to a level equal to the frequency of a first intermediate-frequency signal, the second intermediate-frequency signal is frequency-converted by a BFO signal to a signal having a frequency of voice band, and the frequency of a second locally generated signal is calibrated to set the frequency of the frequency-converted signal to a specified level.

2 Claims, 3 Drawing Sheets

DOUBLE SUPERHETERODYNE RECEIVER WITH INDEPENDENT FREQUENCY CALIBRATION OF TWO LOCAL OSCILLATORS

BACKGROUND OF THE INVENTION

1. Field of the Invention

The present invention relates to a superheterodyne receiver.

2. Description of the Prior Art

Some receivers based on double superheterodyne reception are known to vary both first and second locally generated frequencies for tuning in to stations.

One of these double superheterodyne receivers will be described for example by referring to FIG. 1. In this example, the following frequencies have the following corresponding values:

Received frequency f11 = 150 kHz to 30 MHz (approximately)
First intermediate frequency f13 = 55.845 MHz
Second intermediate frequency f15 = 455 kHz A first locally generated frequency is varied in steps of 1 kHz, while a second locally generated frequency is varied in steps of 100 Hz to vary the received frequency f11 in steps of 100 Hz.

More particularly, a received signal S11 is supplied from an antenna 11 to a first mixer 13 through a high-frequency amplifier 12. At the same time, a first locally generated signal S31 is supplied from a first local oscillator 31 to the mixer 13. A frequency f31 of the locally generated signal S31 relative to the received signal f11 is as follows:

$$f31 = f11 + f13 \quad (1)$$

therefore, $$f31 = (150 \text{ kHz} + 55.845 \text{ MHz}) \text{ to } (30 \text{ MHz} + 55.845 \text{ MHz}) \quad (2)$$

where the frequency f31 varies in steps of 1 kHz.

Thus, the received signal S11 is frequency-converted by the first locally generated signal S31 to a first intermediate-frequency signal S13 (the intermediate frequency f13) in the mixer 13.

The resultant signal S13 is then supplied through a first intermediate-frequency amplifier 14 to a second mixer 15. At the same time, a second locally generated signal or beat-frequency oscillator signal S41 is supplied from a second local oscillator 41 to the second mixer 15. In this case, a frequency f41 of the locally generated signal S41 is as follows relative to the received frequency f11:

$$f41 = f13 - f15$$

$$= f31 - f11 - f15 \quad (3)$$

therefore, $$f41 = (55.39 \text{ MHz} + 0.5 \text{ kHz}) \text{ to } (55.39 \text{ MHz} - 0.4 \text{ kHz}) \quad (4)$$

where the frequency f41 varies in steps of 100 Hz.

Thus, the first intermediate-frequency signal S13 is frequency-converted by the second locally generated signal S41 to a second intermediate-frequency signal S15 (the intermediate frequency f15) in the mixer 15.

The resultant signal S15 is then supplied through a second intermediate-frequency amplifier 16 to an AM detector 17 where an audio signal is demodulated to be sent through a switch circuit 18 to a terminal 19.

When receiving an SSB signal, the intermediate-frequency signal S15 is partially taken from the second intermediate-frequency amplifier 16 to be supplied to a balanced mixer 21. At the same time, a BFO signal S22 having a frequency f22 of 453 kHz for example is taken from a BFO 22 to be supplied to the balanced mixer 21.

Consequently, an audio signal demodulated from the SSB signal is taken from the mixer 21 and, upon reception of the SSB signal, supplied through the switch circuit 18 to the terminal 19.

According to the above constitution, the received frequency f11 is as follows from the equation (3):

$$f11 = f31 - f41 - f15 \quad (5)$$

Since the frequencies f31 and f41 vary, relative to the received frequency f11, inside the respective ranges given by the equations (2) and (4), the received frequency f11, when f31 = 150 kHz + 55.845 MHz and f41 = 55.39 MHz + 0.5 kHz for example, is f31 − f41 − f15 = (150 kHz + 55.845 MHz) − (55.39 MHz + 0.5 kHz) − 455 kHz = 150 kHz − 0.5 kHz.

When f31 = 30 MHz + 55.845 MHz and f41 = 55.39 MHz − 0.4 kHz for example, the received frequency f11 = f31 − f41 − f15 = (30 MHz + 55.845 MHz) − (55.39 MHz − 0.4 kHz) − 455 kHz = 30 MHz + 0.4 kHz. Therefore, the receiving band is approximately 150 kHz to 30 MHz.

According to the equation (5), varying the first locally generated frequency f31 in steps of 1 kHz with the second locally generated frequency f41 being kept constant varies the received frequency f11 in steps of 1 kHz, while varying the second locally generated frequency f41 in steps of 100 Hz with the first locally generated frequency f31 being kept constant varies the received frequency in steps of 100 Hz.

Therefore, respectively varying the first locally generated frequency f31 and the second locally generated frequency f41 varies the received frequency f11 within the receiving band of 150 kHz to 30 MHz in steps of 100 Hz.

As shown in the equation (5), the received frequency f11 of the double superheterodyne receiver of this example is determined by both the first locally generated frequency f31 and the second locally generated frequency f41. Therefore, the first locally generated frequency f31 and the second locally generated frequency f41 must be accurate enough and be able to vary in accordance with the received frequency f11.

To implement this accuracy and ability to vary the frequency, conventional double superheterodyne receivers including the one mentioned above constitute the local oscillators 31 and 41 with a phase-locked loop (PLL) each.

However, since the PLL is expensive, implementing the local oscillators 31 and 41 with PLL's makes receivers expensive.

Even if local oscillators 31 and 41 are constituted with PLL's, the errors and/or fluctuations in the locally generated frequencies f31 and f41 cannot be fully eliminated. And even if they are negligible for the individual frequencies, these errors and/or fluctuations are compounded as shown in the equation (5) to an extent at which the resultant errors and/or fluctuations may not be ignored any more. It is therefore required to arrange the two PLL's so that the errors and/or fluctuations in the locally generated frequencies f31 and f41 if any are canceled in the equation (5), which also results in a costly receiver.

The present invention is intended to solve the above-mentioned problems.

Now, when the locally generated frequency f31 of the local oscillator 31 is made equal to the first intermediate frequency f13, the resultant locally generated signal S31 is supplied through the mixer 13 and the intermediate-frequency amplifier 14 to the mixer 15.

Since the locally generated signal S41 is present at the mixer 15, the locally generated signal S31 supplied to the mixer 15 is frequency-converted by the locally generated signal S41 to the intermediate-frequency signal S15 having the frequency f15 obtained as f15=f31−f41=f13−f41. The resultant signal S15 is supplied through the intermediate-frequency amplifier 16 to the mixer 21.

At the mixer 21, the signal S15 supplied to it is beaten down by the BFO signal S22 (frequency f22), so that a signal S21 having a frequency f21 obtained as f21=f15−f22=f13−f41−f22 is taken from the mixer 21. For example, if the frequency f41 of the locally generated signal f41=(55.39 MHz+0.5 kHz), then f21=55.845 MHz−(55.39 MHz+0.5 kHz)−453 kHz =1.5 kHz; if f41=55.39 MHz, then f21=55.846 MHz −55.39 MHz−453 kHz=2 kHz; and if f41=(55.39 MHz −0.4 kHz), then f21=55.845 MHz−(55.39 MHz−0.4 kHz) −453 kHz=2.4 kHz. That is, if value n is an integer between −5 and +4 inclusive and f41=(55.39 MHz−n×0.1 kHz), then f21=55.845 MHz−(55.39 MHz−n×0.1 kHz)−453 kHz=(2+n×0.1) kHz.

Consequently, if, at the time of frequency calibration:
1) the local oscillator 31 is constituted by a PLL;
2) the frequency f31 generated by the local oscillator 31 is made equal to the first intermediate frequency f13;
3) the local oscillator 41 is constituted by a variable frequency oscillator;
4) a control voltage Vn of the local oscillator 41 when the frequency f21 of the signal S21 is checked and found to be (2+n×0.1) kHz is stored in memory; and
5) the control voltage Vn stored in memory in 4) above is supplied to the local oscillator 41 at the time of reception; then the frequency f41 generated by the local oscillator 41 is calibrated, thereby realizing reception without frequency errors and/or fluctuations.

OBJECTS AND SUMMARY OF THE INVENTION

It is therefore an object of the present invention to provide a superheterodyne receiver which uses the above-mentioned technique to calibrate a frequency f41 generated by a second local oscillator 41 without having to use a costly PLL for the second local oscillator 41.

In carrying out the invention and according to one aspect thereof, there is provided a superheterodyne receiver which frequency-converts in a first mixer 13 a received signal to a first intermediate-frequency signal S13 by a first locally generated signal S31 coming from a first local oscillator 31, frequency-converts in a second mixer 15 the resultant first intermediate-frequency signal S13 to a second intermediate-frequency signal S15 by a second locally generated signal S41 coming from a second local oscillator 41, and supplies the resultant second intermediate-frequency signal S15 to a demodulator 17 for demodulating an original audio signal. This receiver comprises a variable-frequency oscillator consisting in a PLL 30 for implementing the first local oscillator 31 and another variable-frequency oscillator for implementing the second local oscillator 41, wherein at least a frequency f31 of the first locally generated signal S31 is varied at reception to vary the received frequency f11, the frequency f31 of the first locally generated signal S31 is set at frequency calibration to a level equal to a frequency f13 of the first intermediate-frequency signal S13, the second intermediate-frequency signal S15 is frequency-converted by a BFO signal S22 to a signal S21 having a frequency f21 of voice band, and the frequency f41 of the second locally generated signal S41 is calibrated to set the frequency 21 of the frequency-converted signal S21 to a specified level.

This constitution calibrates the frequency f41 generated by the second local oscillator 41 with the first locally generated signal S31 used as a frequency reference signal. Consequently, the second local oscillator 41 need not be made up of the PLL, while the received frequency can be correctly captured.

DESCRIPTION OF THE PREFERRED EMBODIMENTS

Figure 1:
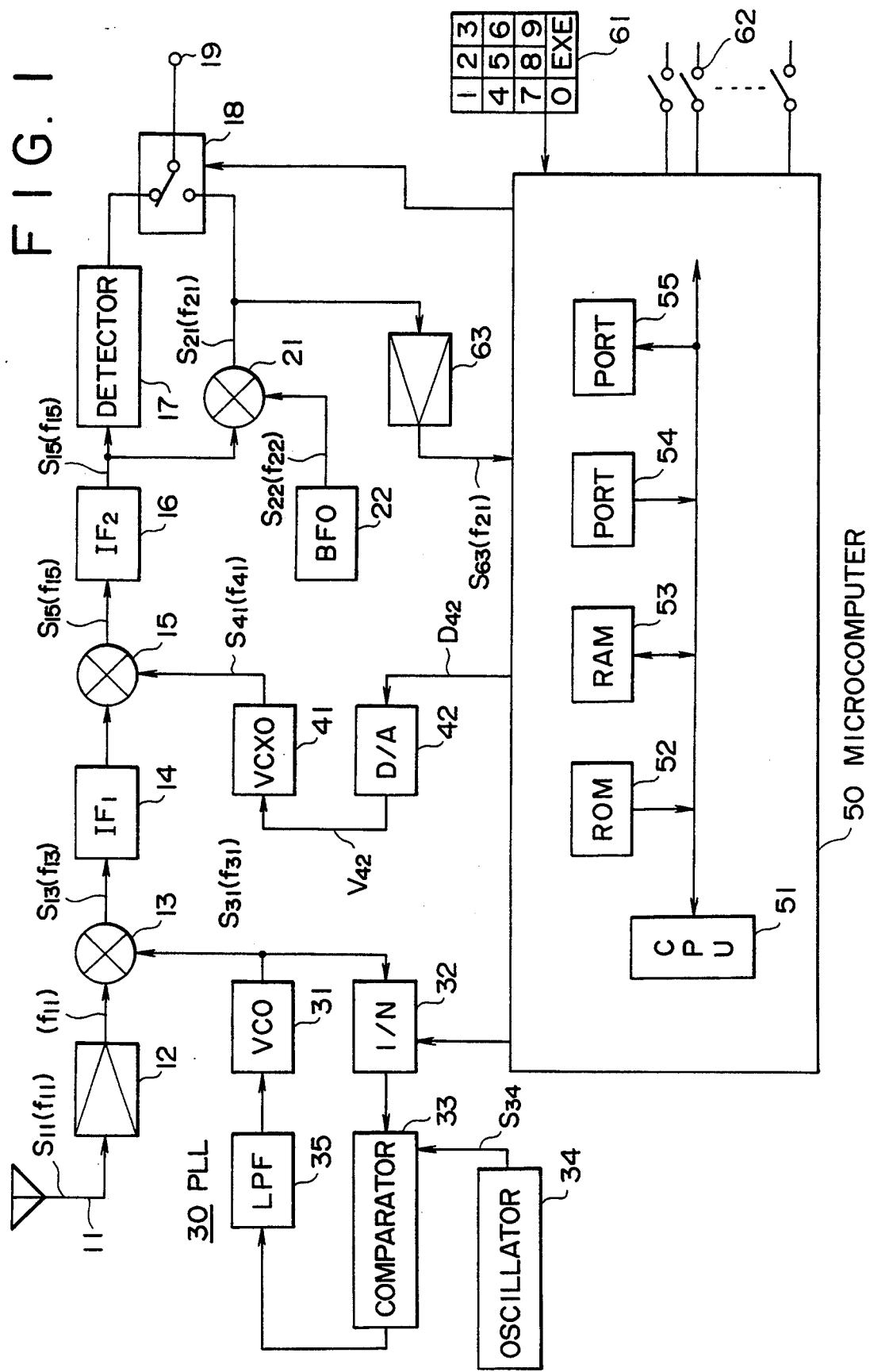
FIG. 1 is a system diagram, showing a preferred embodiment of the present invention.

In FIG. 1, a first local oscillator 31 is a VCO of a PLL 30; that is, the VCO 31 is provided as the local oscillator 31, a signal generated by it being supplied to a first mixer 13 as a first locally generated signal S31. The signal 31 is then supplied to a variable divider 32 to be divided by N. The divided signal is supplied to a phase comparator 33. At the same time, a reference frequency, for example, a signal S34 having a frequency of 1 kHz is taken from a reference oscillator 34 to be supplied to the phase comparator 33. The result of the comparison between the two signals is supplied through a low-pass filter 35 to the VCO 31 as a control voltage.

In a regular state, the divided signal coming from the divider 32 is equal to the generated signal S34 in frequency, so that a frequency f31 of the generated signal S31 is:

$$f31 = N \times 1 \text{ [kHz]}$$

It should be noted here that the equation (5) has been thus established.

Consequently, varying the dividing ratio N between 55995 and 85845 inclusive in steps of one varies the locally generated frequency f31 in the range determined by the equation (2) in steps of 1 kHz, which in turn varies a received frequency f11 in steps of 1 kHz. If N=55845, the generated frequency f31 can be made equal to a first intermediate frequency f13.

A second local oscillator 41 consists in a VCXO. In this case, the VCXO 41 is a variable frequency oscillator comprising a crystal oscillator and a variable-capacitance diode. An output voltage V42 of a D-A converter 42 is applied to the variable-capacitance diode as a control voltage. A signal generated by the VCXO41 is supplied to a second mixer 15 as a second locally generated signal S41. In this example, for simplicity of description, a generated frequency f41 of the VCXO 41 is assumed to be proportional to the level of the output voltage V42.

Consequently, supplying a specified control data D42 to the D-A converter 42 varies the frequency f41 of the signal S41 generated by the VCXO 41 in accordance with the data D42, thereby making it possible to vary, by the data D42, the generated frequency f41 within the range determined by the equation (4) in steps of 100 Hz and vary the received frequency f11 in steps of 100 Hz.

Reference numeral 50 indicates a microcomputer for system control, reference numeral 51 indicates a CPU of the microcomputer, reference numeral 52 indicates a ROM for storing programs, reference numeral 53 indicates a RAM for work area, reference numeral 54 indicates an input port, and reference numeral 55 indicates an output port. The microcomputer 50 is connected to a numeric keypad 61 for directly specifying a value of the received frequency f11 and an operational key group 62 for specifying various operations. Note that the microcomputer 50 is implemented by a $\mu$PD-75328 manufactured by NEC Corporation.

When tuning in on a station, the dividing ratio N is fed from the output port 55 of the microcomputer 50 to be set to the divider 32, while the data D42 are supplied to the D-A converter 42. And a control signal from the microcomputer 50 operates a switch circuit 18 for switching between AM reception and SSB reception.

Operating the key 61 or 62 makes the microcomputer 50 select the received frequency f11 in steps of 100 Hz.

Figure 2:
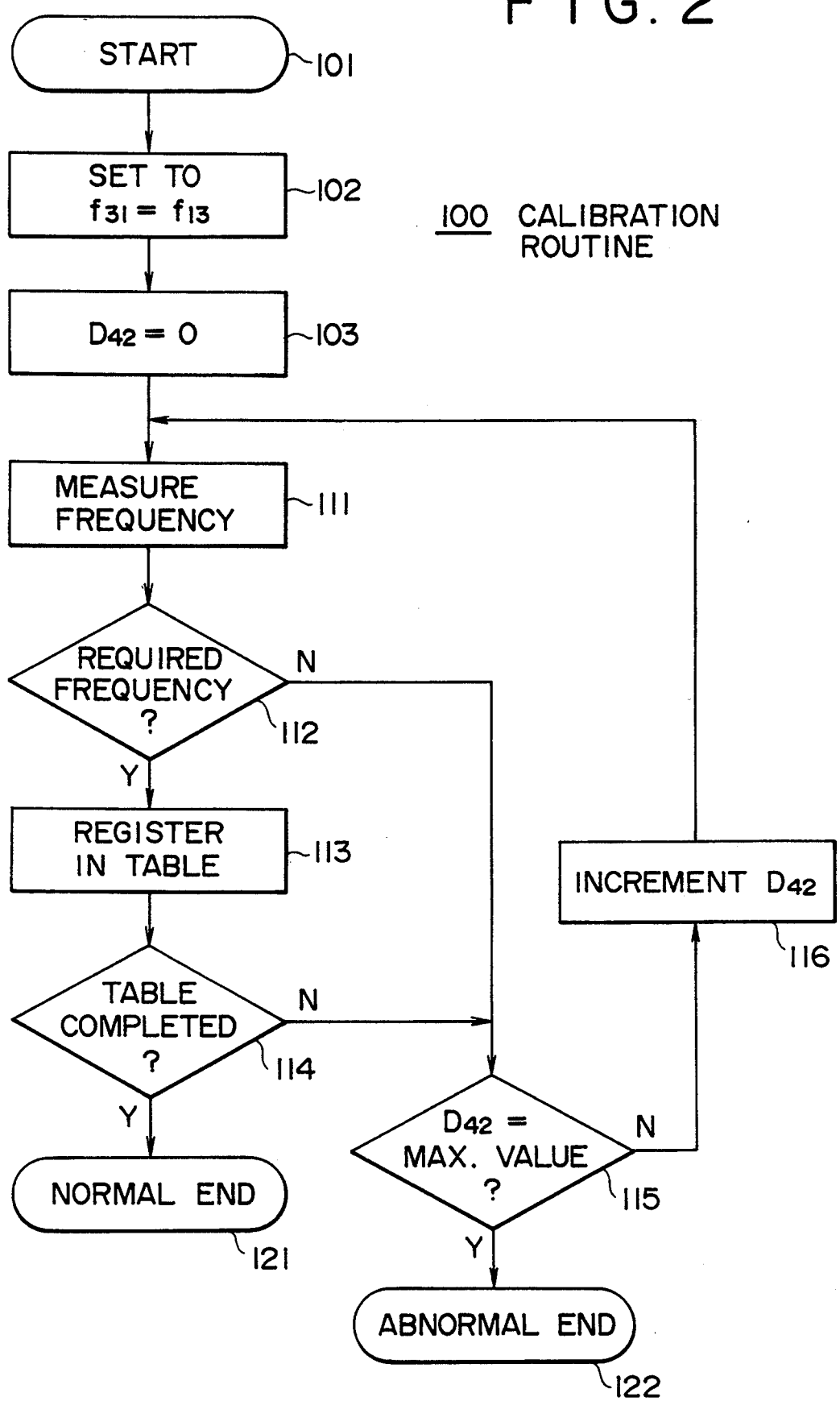
FIG. 2 is a flowchart showing an example of the calibration routine.

A calibration routine 100 shown in FIG. 2 for example is stored in the ROM 52. An output signal S21 of a mixer 21 is supplied to a limiter amplifier 63 to be shaped from a sine-wave signal into an equivalent square-wave signal S63, which is supplied to the input port 54.

Then, the routine 100 is executed by the CPU 51 to calibrate the second locally generated frequency f41 so that the equation (4) is satisfied.

That is, powering on this receiver or operating a key in the key group 62 during reception makes the CPU 51 execute the routine 100 starting with step 101. In step 102, a dividing ratio of 55845 is set from the output port 55 to the divider 32 as the dividing ratio N for calibration. The signal S31 generated by the VCO 31 attains the frequency f31=f13 (=55.845 MHz).

The processing by the CPU 51 goes on to step 103 where the data D42=0 are supplied from the output port 55 to the D-A converter 42. In this case, the frequency f41 generated by the VCXO 41 may only vary between −0.4 kHz and +0.5 kHz around frequency 55.39 MHz as shown in the equation (4); however, if the VCXO 41 has a frequency fluctuation, a variation between −0.4 kHz and +0.5 kHz may not be enough to attain the generated frequency f41 determined by the equation (4).

To solve this problem, the embodiment of the present invention varies the generated frequency f41 by ±1 kHz to use a resultant frequency range that satisfies the equation (4). In step 103, the data D42=0 are supplied to the D-A converter 42 as the data corresponding to the lowest frequency (55.39 MHz−1 kHz) in the range. Therefore, in step 103, the frequency f41 generated by the VCXO41 is regarded as the frequency (55.39 MHz−1 kHz) if the VCXO41 has no frequency fluctuation.

Figure 3:
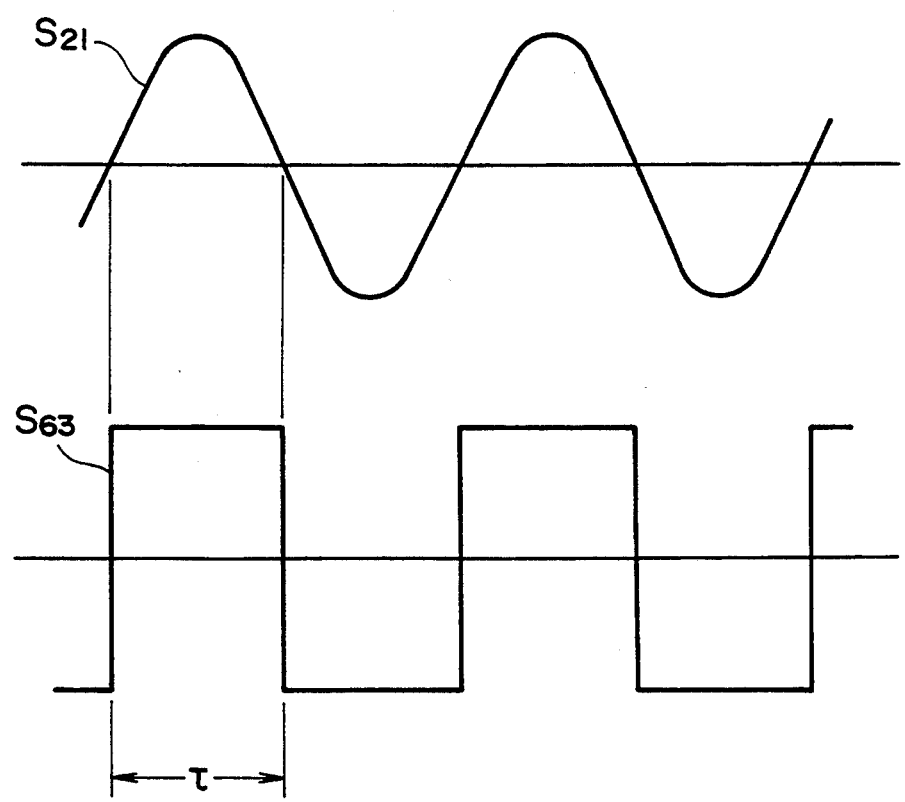
FIG. 3 is a diagram showing the waveforms obtained at frequency measurement.

Then, the processing by the CPU 51 goes to step 111 where a frequency of the square-wave signal S63 is measured. This measurement corresponds to the checking operation shown in 4) in the Description of the Prior Art herein and is implemented by counting the number of clock pulses of the microcomputer 50 in a half cycle period $\tau$ of the signal S63 as shown in FIG. 3. Thus, the frequency of the signal S63, that is, the frequency f21 of the signal S21 is measured.

Next, the processing by the CPU 51 goes to step 112 where the frequency measured in step 111 is checked to see whether it can be used as the frequency f21 shown in 4) in the Description of the Prior Art herein.

Namely, if the D-A converter 42 is constituted by 8 bits for example, these 8 bits cover the frequency f41's variation range ±1 kHz, so that the resolution per bit is 2 kHz/256 steps, that is, approximately 8 Hz. This means that each time the LSB (Least Significant Bit) of the data D42 changes, the frequency f41 varies by about 8 Hz. In step 112, therefore, the frequency measured in step 111 is checked to see whether it is a frequency falling within a 4 Hz range of the frequency 21, a half of the 8 Hz resolution.

If the frequency measured in step 111 is found by the check to have a value which can be used as the frequency 21 shown in 4) in the Description of the Prior Art herein, the processing by the CPU 51 proceeds from step 112 to step 113 where the values of the data D42 supplied to the D-A converter 42 are registered in a frequency table FTBL in the RAM 53.

Then, the processing by the CPU 51 goes to step 114 where the frequency table FTBL is checked for entries of all the data D42 (corresponding to n=−5 to +4) necessary for satisfying the equation (4). If no entry is found, the processing proceeds from step 114 to step 115 where the data D42 are checked to see whether they have reached a highest value. If the highest value has not been reached, the processing proceeds from step 115 to step 116 where the data D42 are incremented by one LSB. Then, the processing returns to step 111. It should be noted that, if the frequency measured in step 111 cannot be used in step 112 as the frequency f21 indicated in 4) in the Description of the Prior Art herein, then the processing proceeds from step 112 to step 115.

Accordingly, repeating a loop of step 111 through step 116 sequentially registers in the frequency table FTBL all the data D42 necessary for establishing the equation (4), or the data D42 corresponding to n=+5 to +4.

When the data D42 have all been registered, the processing by the CPU 51 proceeds from step 114 to step 121 where this routine 100 normally terminates.

At the time of reception, the data D42 are read from the frequency table FTBL according to a tune-in operation done to be supplied to the D-A converter 42. Hence, the locally generated frequency f41 varies within the range indicated in the equation (4) in steps of 100 Hz. And, because the frequency f41 has been calibrated by the routine 100, a tuned-in station can be received with the calibrated, correct frequency.

It should be noted that, when the data D42 have reached the highest value in step 115, the processing proceeds from step 115 to step 122 where it abnormally terminates even if all the data D42 corresponding to n=5 to +4 have not yet been registered in the frequency table FTBL, because the data D42 cannot be made greater than the highest value.

Thus, turning on the power of the receiver or operating a key in the key group 62 thereon during reception makes the CPU 51 execute the routine 100 to calibrate the second locally generated frequency f41.

The above constitution indicates the situation in which the received frequency is varied by varying the second locally generated frequency f41. When the second locally generated frequency f41 is fixed, if the accuracy or stability of the frequency cannot be fully guaranteed, the frequency may also be calibrated in the same way as described for the above constitution. It should also be noted that, while the above constitution employs double superheterodyne reception, the present invention applies to triple and higher-order superheterodyne receptions methods as well.

According to the present invention, the receiver based on double superheterodyne reception as described above is constituted so that the second locally generated frequency f41 is calibrated to surely receive a station having a desired frequency. And the novel receiver does not require to use an expensive PLL for the second local oscillator 41, thereby lowering manufacturing cost.

If an oscillator for generating a reference frequency for calibration is separately provided, errors and/or fluctuations in the frequency generated by the oscillator are directly reflected in the errors and/or fluctuations in the second locally generated frequency f41 upon its calibration. Therefore, the oscillator must generate the frequency which is correct and stable enough for proper reception, thereby raising the manufacturing cost.

However, according to the present invention, the first locally generated frequency f31, which is high in accuracy and stability from the beginning, is set at the time of calibration to a level equal to the first intermediate frequency f13 to be used for the signal having the calibration frequency, thereby eliminating the necessity for separately providing the expensive reference-frequency oscillator.

Additionally, according to the present invention, the second intermediate-frequency signal S15 is beaten down by the BFO signal S22 in the mixer 21 for SSB reception to check the frequency of the beaten down signal S21 at the time of calibration, permitting the microcomputer 50 for system control to easily perform the checking operation. This also contributes to the elimination of the necessity for separately providing a special circuit.

Accordingly, as clearly seen from FIG. 1, the present invention adds only the limiter amplifier 63 to a basic circuitry required for superheterodyne reception to calibrate the second locally generated frequency f41, thereby lowering the manufacturing cost as a whole.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. A superheterodyne receiver performing a plurality of frequency converting operations and having at least a first mixer connected to receive a signal having a desired frequency and to a first local oscillator to produce a first intermediate-frequency signal, and a second mixer connected to an output of the first mixer and to a second local oscillator to produce a second intermediate-frequency signal, said receiver comprising:
   a phase-locked loop for implementing said first local oscillator; and
   means excluding a phase-locked loop and including a variable frequency oscillator for implementing said second local oscillator; control means connected to control said first and said second local oscillators;
   wherein said received signal is supplied to said first mixer the output of which is varied by varying at least a frequency generated by said first local oscillator in response to a control signal from said control means, a frequency of said first oscillator is frequency calibrated by said control means to a frequency of the first intermediate-frequency signal, the second intermediate-frequency signal supplied by said second mixer is frequency-converted by a beat-frequency oscillator signal to a signal having a frequency of voice band, and a frequency of said second local oscillator is frequency calibrated independently of said first local oscillator by said control means, whereby a signal resulting from the frequency conversion in said second mixer is set to a specified frequency.

2. A superheterodyne receiver according to claim 1, wherein said control means comprises:
   a microcomputer whereby powering on said superheterodyne receiver or a user's providing an input to said microcomputer executes a routine for frequency calibration.

* * * * *